United States Patent
Ogawa

(10) Patent No.: US 6,256,441 B1
(45) Date of Patent: Jul. 3, 2001

(54) OPTICAL WAVEGUIDE AND MANUFACTURING THEREOF

(75) Inventor: Tsuyoshi Ogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/350,294

(22) Filed: Jul. 9, 1999

(30) Foreign Application Priority Data

Jul. 21, 1998 (JP) .................................................. 10204945

(51) Int. Cl.⁷ ....................................................... G02B 6/10
(52) U.S. Cl. ............................ 385/129; 385/14; 385/131; 430/321
(58) Field of Search ................................. 385/129, 14, 11, 385/16, 37, 43, 49, 123, 130, 132, 131; 430/321, 320, 5, 270.1, 281.1; 525/265

(56) References Cited

U.S. PATENT DOCUMENTS 6,037,105 * 3/2000 You et al. ............................. 430/321

* cited by examiner

Primary Examiner—Phan T. H. Palmer
(74) Attorney, Agent, or Firm—Sonneschein, Nath & Rosenthal

(57) ABSTRACT

Disclosed are a method of manufacturing an optical waveguide including core portions having a small surface roughness and also having highly accurately rectangular shapes without requiring a large number of the manufacturing steps, and an optical waveguide with a small propagation loss of light. The optical waveguide includes a substrate; a lower clad layer formed on the substrate; core portions formed on the lower clad layer; and an upper clad layer formed to cover the lower clad layer and the core portions; wherein the substrate is made from a material which is transparent to light having a specific wavelength, and the core portions are made from a material which is hardened by irradiation of the light having the specific wavelength. If the light having the specific wavelength is ultraviolet light, the core portions are made from an ultraviolet hardening-type material hardened by irradiation of ultraviolet light and the substrate is made from either quartz or glass transparent to ultraviolet light.

3 Claims, 3 Drawing Sheets

OPTICAL WAVEGUIDE AND MANUFACTURING THEREOF

RELATED APPLICATION DATA

The present application claims priority to Japanese Application No. P10 204945 filed Jul. 21, 1998, which application is incorporated herein by reference to the extent permitted by law.

BACKGROUND OF THE INVENTION

The present invention relates to an optical waveguide and a method of manufacturing the optical waveguide, and particularly to an optical waveguide including a lower clad layer, core portions formed on the lower clad layer, and an upper clad layer formed to cover the lower clad layer and the core portions, and a method of manufacturing the optical waveguide.

In the field of semiconductor devices, it has been attempted to make the operational speed higher and make the scale of integration larger. For example, significant development has been made to make the performance of microprocessors higher and make the capacity of memory chips larger. To expedite the above development even further, it is required to make the operational speed higher along signal interconnections, make the arrangement density of signal interconnections larger, and improve a delay in signal along electric wiring, and also it is essential to take a suitable measure against EMI (Electro Magnetic Interference) caused by making the operational speed higher and making the arrangement density of signal interconnections larger. As a means for solving the above-described problems, an optical interconnection has been examined. The optical interconnection may be considered to be used in various conditions, typically, between apparatuses, between boards in an apparatus, or between chips in a board. In particular, it may be considered that an optical transmission/communication means using an optical waveguide as a transmission path be suitable for relatively short distance transmission of signals, for example, between chips. In order to get the optical transmission/communication means using the optical waveguide into widespread use, it is important to establish a process of manufacturing the optical waveguide.

The optical waveguide is required to have a small propagation loss of light, and to be manufactured through simple manufacturing steps. With respect to the propagation loss of light, it may be considered that the optical waveguide be manufactured using a material small in propagation loss of light such as quartz. As verified in the case being applied to an optical fiber, quartz is very good in light transmittance, and in actual fact, the optical waveguide manufactured using quartz exhibits a low propagation loss in a range of 0.1 dB/cm or less. The optical waveguide manufactured using quartz, however, problems in requiring a large number of manufacturing steps, in particular, a heat-treatment step at a high temperature of 800° C. or more, and being difficult to ensure a large area of the optical waveguide. For this reason, the optical waveguide has been manufactured using a high polymer material capable of being treated at a low temperature, for example, polymethyl methacrylate or polyimide. Hereinafter, a related art optical waveguide in which core portions made from a high polymer are formed on a substrate will be described with reference to FIGS. 3A to 3D which are schematic diagrams illustrating steps of manufacturing the optical waveguide.

First, as shown in FIG. 3A, a lower clad layer 2 is formed on a substrate 1 made from silicon or glass by spin-coating and necessary heat-treatment.

A core layer 3 having a refractive index larger than that of the lower clad layer 2 is, as shown in FIG. 3B, formed on the lower clad layer 2.

The core layer 3 is, as shown in FIG. 3C, subjected to patterning by photolithography and etching such as RIE (Reactive Ion Etching), to form rectangular core portions 3a to be taken as an optical waveguide pattern.

Finally, as shown in FIG. 3D, an upper clad layer 4 is formed to cover the core portions 3a and the lower clad layer 2 by spin-coating and necessary heat-treatment, to obtain an embedded channel-type optical waveguide.

If the core portions 3a are formed by dry etching such as RIE at the step shown in FIG. 3C, the dry etching is generally performed in an oxygen atmosphere. In such a dry etching, if the RF power becomes large, the surface roughness of each core portion 3a becomes large, and if the gas pressure becomes smaller, the surface roughness of the core portion 3a becomes smaller but the side wall of the core portion 3a tends to be etched. Accordingly, to form the core portions 3a having a small surface roughness and also having highly accurate rectangular shapes, it is required to perform the dry etching at a small RF power and an optimum gas pressure.

However, if the RF power is set at a small value in the above dry etching for forming the core portions 3a to be taken as an optical waveguide, there arise problems that the number of manufacturing steps becomes large for a multimode optical waveguide in which the thickness of the core portions 3a is in a range of several tens $\mu$m to several hundreds $\mu$m, although it does not become large for a single mode optical waveguide in which the thickness of the core portions 3a is in a range of several $\mu$m to 10 $\mu$m, and that the surface roughnesses of both a side wall of each core portion 3a and the lower clad layer 2 become larger to thereby increase the propagation loss of light passing through the core portions 3a constituting the optical waveguide.

SUMMARY OF THE INVENTION

An object of the present invention is to provide a method of manufacturing an optical waveguide including core portions having a small surface roughness and also having highly accurate rectangular shapes without requiring a large number of the manufacturing steps, and to provide an optical waveguide with a small propagation loss of light.

To achieve the above object, according to a first aspect of the present invention, there is provided an optical waveguide including: a substrate; a lower clad layer formed on the substrate; core portions formed on the lower clad layer; and an upper clad layer formed to cover the lower clad layer and the core portions; wherein the substrate is made from a material which is transparent to light having a specific wavelength, and the core portions are made from a material which is hardened by irradiation of the light having the specific wavelength. If the above light having the specific wavelength is ultraviolet light, the substrate may be made from a material transparent to ultraviolet light, for example, either quartz or glass, and the core portions may be made from a material hardened by irradiation of ultraviolet light, for example, an ultraviolet hardening-type resin.

According to a second aspect of the present invention, there is provided a flexible optical waveguide including: a lower clad layer; core portions formed on the lower clad layer; and an upper clad layer formed to cover the lower clad layer and the core portions; wherein the substrate is made from a material which is transparent to light having a specific wavelength, and the core portions are made from a material which is hardened by irradiation of the light having the specific wavelength. If the above light having the specific wavelength is ultraviolet light, the substrate may be made from a material transparent to ultraviolet light, for example, either quartz or glass, and the core portions may be made from a material hardened by irradiation of ultraviolet light, for example, an ultraviolet hardening-type resin.

According to a third aspect of the present invention, there is provided a method of manufacturing an optical waveguide, including the steps of: forming a lower clad layer on a substrate made from a material transparent to light having a specific wavelength; forming a light cutoff film, which cuts off the light having the specific wavelength, on the lower clad layer; patterning the light cutoff film into a pattern having openings; forming a core layer, which is made from a material hardened by irradiation of the light having the specific wavelength, on the light cutoff film; irradiating the core layer with the light having the specific wavelength from the substrate side, to harden portions, positioned at the openings of the light cutoff film, of the core layer; removing non-hardened portions of the core layer, to render the hardened portions left as core portions; removing the light cutoff film; and forming an upper clad layer to cover the lower clad layer and the core portions. If the above light having the specific wavelength is ultraviolet light, the substrate may be made from a material transparent to ultraviolet light, for example, either quartz or glass; the light cutoff film may be made from a film of a metal such as chromium; and the core portions may be made from a material hardened by irradiation of ultraviolet light, for example, an ultraviolet hardening-type resin. In addition, to form core portions having a small surface roughness and also having highly accurate rectangular shapes, the light having the specific wavelength, entered from the substrate side, is desirable to be adjusted as a collimated light beam having a uniform energy distribution in the irradiation direction.

According to a fourth aspect of the present invention, there is provided a method of manufacturing a flexible optical waveguide, including the steps of: forming a separation film on a substrate transparent to light having a specific wavelength; forming a lower clad layer on the separation film; forming a light cutoff film, which cuts off the light having the specific wavelength, on the lower clad layer; patterning the light cutoff film into a pattern having openings; forming a core layer, which is made from a material hardened by irradiation of the light having the specific wavelength, on the light cutoff film; irradiating the core layer with the light having the specific wavelength from the substrate side, to harden portions, positioned at the openings of the light cutoff film, of the core layer; removing non-hardened portions of the core layer, to render the hardened portions left as core portions; removing the light cutoff film; forming an upper clad layer to cover the lower clad layer and the core portions; and removing the separation film, to collectively separate, from the substrate, the lower clad layer, the pattern of the core portions, and the upper clad layer which are formed on the separation film. If the above light having the specific wavelength is ultraviolet light, the substrate may be made from a material transparent to ultraviolet light, for example, either quartz or glass; the separation film may be made from a material soluble typically in a weak hydrofluoric acid, such as silicon oxide; the light cutoff film may be made from a film of a metal such as chromium; and the core portions may be made from a material hardened by irradiation of ultraviolet light, for example, an ultraviolet hardening-type resin. In addition, to form core portions having a small surface roughness and also having highly accurate rectangular shapes, the light having the specific wavelength, entered from the substrate side, is desirable to be adjusted as a collimated light beam having a uniform energy distribution in the irradiation direction.

According to the present invention having the above configuration, it is possible to form the core portions having a small surface roughness and also having highly accurate rectangular shapes following those of the openings of the light cutoff film, and hence to provide an optical waveguide readily with a small propagation loss in light without requiring a large number of the manufacturing steps.

DETAILED DESCRIPTION OF THE PREFERRED EMBODIMENTS

Figure 1A:
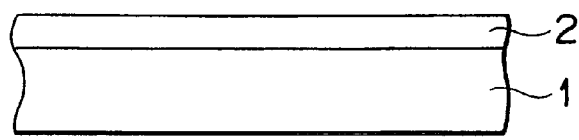
FIGS. 1A to 1G are schematic diagrams illustrating steps of manufacturing an optical waveguide according to a first embodiment of the present invention.

The present invention is applicable to an optical waveguide including a lower clad layer, core portions formed on the lower clad layer, and an upper clad layer formed to cover the lower clad layer and the core portions, and to a method of manufacturing the optical waveguide. Hereinafter, embodiments of the present invention will be described with reference to FIGS. 1A to 1G and FIGS. 2A to 2H. In these figures, parts corresponding to those described in the related art are designated by the same reference numerals.

<First Embodiment>

In this embodiment, the present invention is applied to an optical waveguide including a substrate, a lower clad layer formed on the substrate, core portions formed on the lower clad layer, and an upper clad layer formed to cover the lower clad layer and the core portions. Hereinafter, a method of manufacturing such an optical waveguide will be described with reference to FIGS. 1A to 1G which are diagrams schematically illustrating steps of manufacturing the optical waveguide.

First, as shown in FIG. 1A, a lower clad layer 2 is formed on a substrate 1.

The lower clad layer 2 can be formed by a usual method capable of forming a film having a uniform thickness, for example, a spin-coating method, a spraying method, or a method of laminating a previously formed film. At this step, if the substrate 1 is coated with a material, which is capable of being hardened by irradiation of light, by spin-coating or spraying to form the lower clad layer 2, the material thus applied is hardened by irradiation of light. Meanwhile, if the substrate 1 is coated with a material, which is capable of being hardened by heating, by spin-coating or spraying to form the lower clad layer 2, the material thus applied is hardened by heating at a high temperature.

Figure 1B:
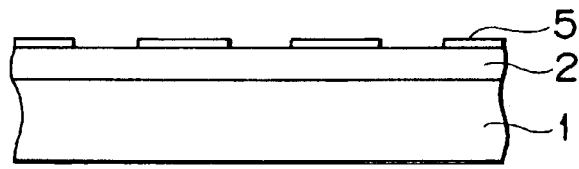

As shown in FIG. 1B, a light cutoff film 5 is formed on the lower clad layer 2 and is then patterned such that portions, arranged at positions where core portions 3a are to be formed later, of the light cutoff film 5 are opened. That is to say, the pattern of the light cutoff film 5, which has openings at the positions where the core portions 3a are to be formed, is a negative pattern to the core portions 3a. The light cutoff film 5 is patterned by a usual patterning method, for example, a method of forming a resist pattern on the light cutoff film 5 using photolithography and etching the light cutoff film 5 using the resist pattern as a mask, or a method of previously forming a resist pattern on the lower clad layer 2, forming the light cutoff film 5 thereon, and patterning the light cutoff film 5 by lift-off. The light cutoff film 5 is made from a material which cuts off light 6 having a specific wavelength used for hardening the core portions 3a to be formed at the subsequent step and which has good adhesiveness to the lower clad layer 2. Specific examples of the materials may include a metal such as chromium or tantalum, and an organic material. If the light cutoff film 5 is made from chromium, it is desirable to be formed to a thickness of $10^{-8}$ m or more capable of sufficiently cutting off the light 6 having the specific wavelength used for hardening the core portions 3a, and further it is more desirable to be formed to a thickness of about $10^{-7}$ m in consideration of the subsequent step of removing the light cutoff film 5.

Figure 1C:
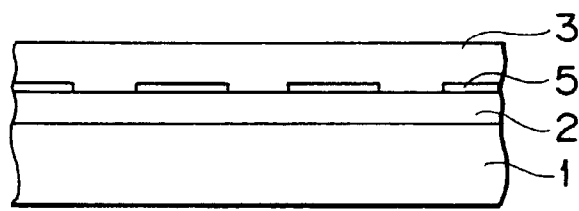

Then, as shown in FIG. 1C, a core layer 3 is formed to cover the light cutoff film 5 and the lower clad layer 2. The core layer 3 can be formed by a usual method of capable of forming a film having a uniform thickness, for example, the spin-coating or spraying method. In addition, the core layer 3 is made from a material capable of being hardened by irradiation of the light 6 having the specific wavelength, for example, made from an ultraviolet hardening-type resin capable of being hardened by irradiation of ultraviolet rays.

Figure 1D:
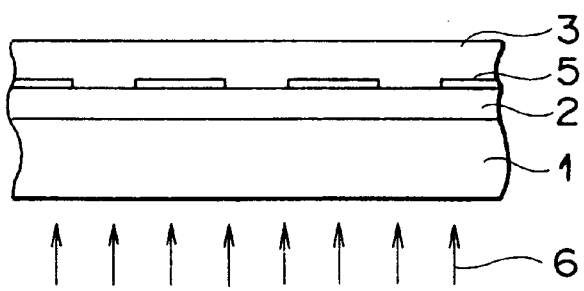

Next, as shown in FIG. 1D, the core layer 3 is irradiated with the light 6 having the specific wavelength from the substrate 1 side to harden the portions positioned at the openings of the pattern of the light cutoff film 5. To be more specific, the light 6 having the specific wavelength, entered from the substrate 1 side, passes through both the substrate 1 and the lower clad layer 2. The light 6 is then cutoff by the solid portions of the light cutoff film 5, but passes through the openings of the light cutoff film 5. That is to say, the light 6 is made incident on the portions to be taken as the core portions 3a, formed at the openings of the light cutoff film 5, of the core layer 3, to harden the portions to be taken as the core portions 3a, of the core layer 3, thereby forming the core portions 3a having shapes following those of the openings of the light cutoff film 5. In this case, to form the core portion 3a having a side wall being small in surface roughness and also having a highly accurate rectangular shape following that of the opening of the pattern of the light cutoff film 5, the light 6 having the specific wavelength is desirable to be adjusted as a collimated light beam having a uniform energy distribution in the irradiation direction.

Figure 1E:
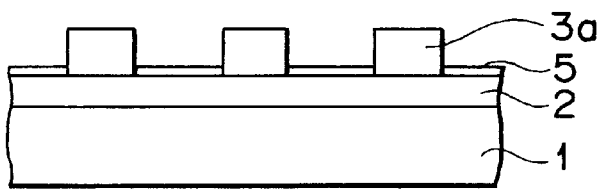

As shown in FIG. 1E, the portions, not exposed to the light 6 having the specific wavelength, of the core layer 3 are removed, to form the highly accurate rectangular core portions 3a having the shapes following those of the openings of the pattern of the light cutoff film 5. The portions, not exposed to the light 6 having the specific wavelength, of the core layer 3 can be easily removed by an organic solvent. If the core layer 3 is made from an epoxy based ultraviolet hardening-type resin, ethanol may be used as the organic solvent. The core portion 3a thus formed by irradiation of the light 6 having the specific wavelength has a side wall being small in surface roughness and also has a highly accurate rectangular shape having a vertical plane with respect to the principal plane of the substrate 1.

Figure 1F:
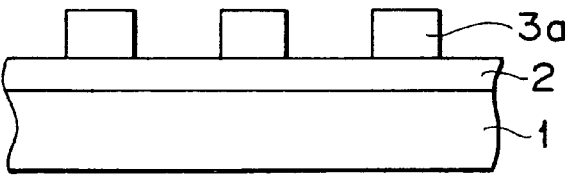

As shown in FIG. 1F, the light cutoff film 5 remaining on the lower clad layer 2 is removed. If the light cutoff film 5 is made from a chromium film, it can be easily removed by hydrochloric acid or the like. In this case, it is important to remove the light cutoff film 5 without exerting adverse effect on both the core portions 3a and the lower clad layer 2.

Figure 1G:
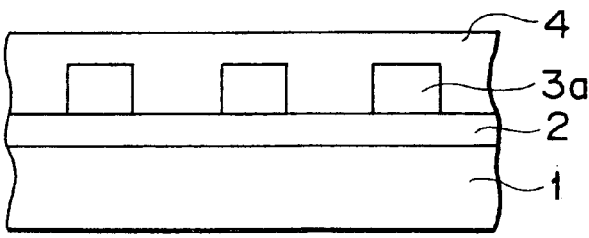

Finally, as shown in FIG. 1G, an upper clad layer 4 is formed to cover the core portions 3a and the lower clad layer 2, to thus obtain an optical waveguide including the core portions 3a which are highly accurately patterned and are small in propagation loss of light. In addition, the upper clad layer 4 can be formed by a usual method capable of forming a film having a uniform thickness, for example, the spin-coating or spraying method, or the method of laminating a previously film. At this step, if the core portions 3a and the lower clad layer 2 are coated with a material, which is capable of being hardened by irradiation of light, by spin-coating or spraying to form the upper clad layer 4, the material thus applied is hardened by irradiation of light; and if the core portions 3a and the lower clad layer 2 are coated with a material, which is capable of being hardened by heating, by spin-coating or spraying to form the upper clad layer 4, the material thus applied is hardened by heating at a high temperature.

<Second Embodiment>

In this embodiment, the present invention is applied to a flexible optical waveguide including a lower clad layer formed on a substrate, core portions formed on the lower clad layer, and an upper clad layer formed to cover the lower clad layer and the core portions. Hereinafter, a method of manufacturing such a flexible optical waveguide will be described with reference to FIGS. 2A to 2H which are diagrams schematically illustrating steps of manufacturing the flexible optical waveguide.

Figure 2A:
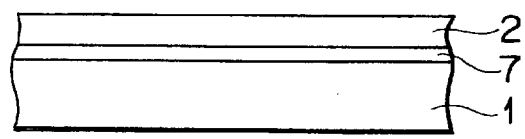
FIGS. 2A to 2H are schematic diagrams illustrating steps of manufacturing a flexible optical waveguide according to a second embodiment of the present invention.
Figure 2B:
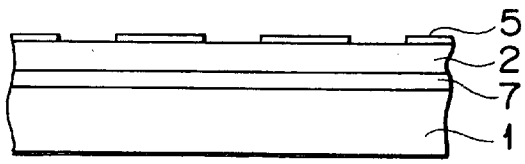
Figure 2C:
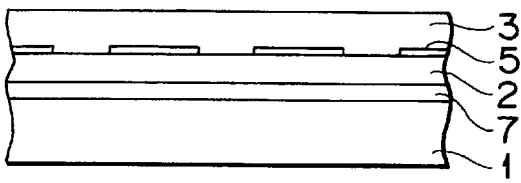
Figure 2D:
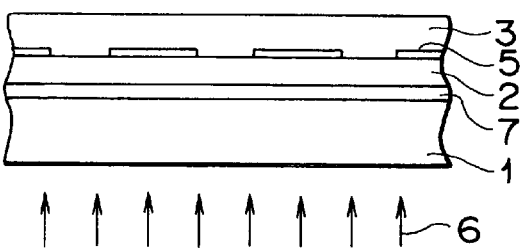
Figure 2E:
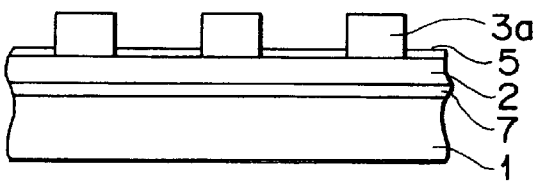
Figure 2F:
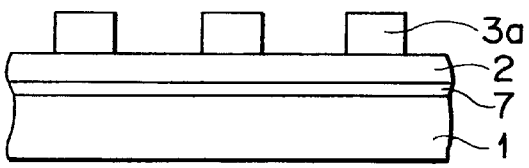

First, as shown in FIG. 2A, a separation film 7 is formed on a substrate 1, and a lower clad layer 2 is formed on the separation film 7. Like the first embodiment, the substrate 1 is made from a material transparent to the light 6 having the specific wavelength, for example, quartz or glass such as BK-7. The separation film 7 is also made from a material transparent to the light 6 having the specific wavelength, for example, a dielectric film such as silicon oxide or a film made from an organic material. Further, the lower clad layer 2 is formed by a usual method capable of forming a film having a uniform thickness, for example, the spin-coating or spraying method, or the method of laminating a previously formed film. At this step, if the separation film 7 is coated with a material, which is capable of being hardened by irradiation of light, by spin-coating or spraying to form the lower clad layer 2, the material thus applied is hardened by irradiation of light. Meanwhile, if the separation film 7 is coated with a material, which is capable of being hardened by heating, by spin-coating or spraying to form the lower clad layer 2, the material thus applied is hardened by heating at a high temperature.

The subsequent steps shown in FIGS. 2B to 2F are the same as those shown in FIGS. 1B to 1F, and therefore, the overlapped description thereof is omitted.

Figure 2G:
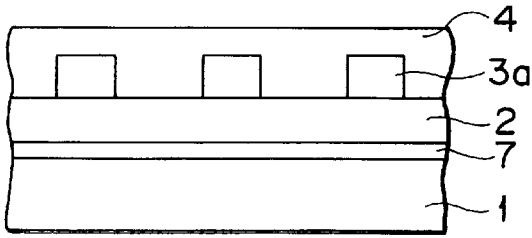

Then, as shown in FIG. 2G, an upper clad layer 4 is formed to cover core portions 3a and the lower clad layer 2. In addition, the upper clad layer 4 can be formed by a usual method capable of forming a film having a uniform thickness, for example, the spin-coating or spraying method, or the method of laminating a previously film. At this step, if the core portions 3a and the lower clad layer 2 are coated with a material, which is capable of being hardened by irradiation of light, by spin-coating or spraying to form the upper clad layer 4, the material thus applied is hardened by irradiation of light; and if the core portions 3a and the lower clad layer 2 are coated with a material, which is capable of being hardened by heating, by spin-coating or spraying to form the upper clad layer 4, the material thus applied is hardened by heating at a high temperature.

Figure 2H:
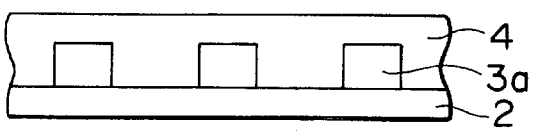
Figure 3A:
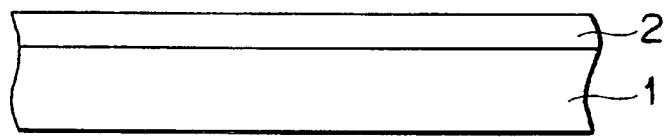
FIGS. 3A to 3D are schematic diagrams illustrating steps of manufacturing a prior art optical waveguide.
Figure 3B:
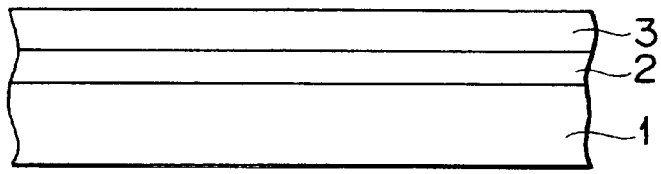
Figure 3C:
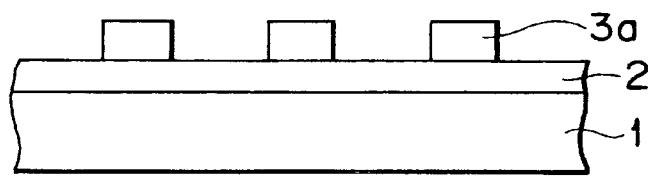
Figure 3D:
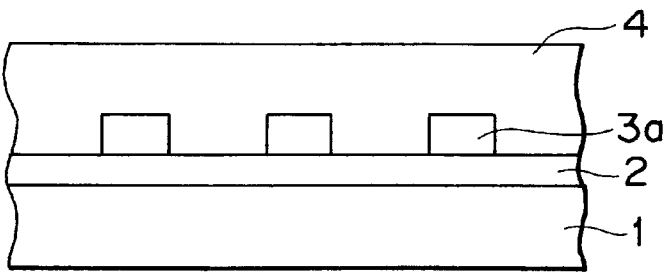

Finally, as shown in FIG. 2H, the lower clad layer 2, the core portions 3a, and the upper clad layer 4 formed on the separation film 7 are collectively separated from the substrate 1 by removing the separation film 7, to thus obtain a flexible optical waveguide including the core portions 3a which are highly accurately patterned and are small in propagation loss of light. In addition, it is important to remove the separation film 7 without exerting adverse effect on the core portions 3a, the lower clad layer 2 and the upper clad layer 4. If the separation film 7 is made from silicon oxide, it can be removed by a separation liquid such as a weak hydrofluoric acid.

While the preferred embodiments of the present invention have been described using the specific terms, such description is for illustrative purposes only, and it is to be understood that changes and variations may be made without departing from the sprit or scope of the following claims.

What is claimed is:

1. A method of manufacturing an optical waveguide, comprising the steps of:

forming a separation film on a substrate transparent to light having a specific wavelength;

forming a lower clad layer on said separation film;

forming a light cutoff film, which cuts off said light having the specific wavelength, on said lower clad layer;

patterning said light cutoff film into a pattern having openings;

forming a core layer, which is made from a material hardened by irradiation of said light having the specific wavelength, on said light cutoff film;

irradiating said core layer with said light having the specific wavelength from said substrate side, to harden portions, positioned at said openings of said light cutoff film, of said core layer;

removing non-hardened portions of said core layer, to render said hardened portions left as core portions;

removing said light cutoff film;

forming an upper clad layer to cover said lower clad layer and said core portions; and removing said separation film, to collectively separate, from said substrate, said lower clad layer, the pattern of said core portions, and said upper clad layer which are formed on said separation film.

2. A method of manufacturing an optical waveguide according to claim 1, wherein said substrate is made from either quartz or glass, and said core portions are made from an ultraviolet hardening-type resin.

3. A method of manufacturing an optical waveguide according to claim 1, wherein said light cutoff film is a metal film.

* * * * *